(12) United States Patent
Lin et al.

(10) Patent No.: US 12,426,195 B2
(45) Date of Patent: Sep. 23, 2025

(54) FUNCTIONAL MODULE SECURING DEVICE AND DATA PROCESSING EQUIPMENT

(71) Applicant: Fulian Precision Electronics (Tianjin) Co., LTD., Tianjin (CN)

(72) Inventors: Jia-Feng Lin, New Taipei (TW); Wen-Chen Wang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 191 days.

(21) Appl. No.: 18/378,093

(22) Filed: Oct. 9, 2023

(65) Prior Publication Data
US 2024/0334638 A1  Oct. 3, 2024

(30) Foreign Application Priority Data
Mar. 28, 2023 (CN) .......................... 202310316317.5

(51) Int. Cl.
*G06F 1/18* (2006.01)
*H05K 7/14* (2006.01)

(52) U.S. Cl.
CPC ........... *H05K 7/1489* (2013.01); *G06F 1/185* (2013.01); *G06F 1/186* (2013.01); *G06F 1/187* (2013.01)

(58) Field of Classification Search
CPC ...... G06F 1/1658; G06F 1/1684; G06F 1/183; G06F 1/184; G06F 1/185; G06F 1/186; G06F 1/187; H05K 7/02; H05K 7/1418; H05K 7/1461; H05K 7/1487; H05K 7/1489; H05K 7/183; H05K 5/0221; H05K 5/0286; G06K 13/08; G06K 13/0806; G06K 13/0831; G06K 13/0856
See application file for complete search history.

(56) References Cited

U.S. PATENT DOCUMENTS 6,315,583 B1 * 11/2001 Nishioka ............ G06K 13/0856
439/131
6,654,240 B1 * 11/2003 Tseng ...................... G06F 1/184
361/679.33
6,739,890 B2 * 5/2004 Hirata ................ G06K 13/0806
439/159

(Continued)

FOREIGN PATENT DOCUMENTS

TW M607943 U 2/2021

*Primary Examiner* — Allen L Parker
*Assistant Examiner* — Gage Crum
(74) *Attorney, Agent, or Firm* — ScienBiziP, P.C.

(57) ABSTRACT

A functional module securing device and a data processing equipment, including a securing rack including a mounting area, the mounting area places a functional module; a limit piece slidably arranged on an exterior of the securing rack and at least partially located in the mounting area; and a linkage piece arranged on the exterior of the securing rack and connected to the limit piece. The linkage piece configured to drive the limit piece to move along a first direction to at least partially insert the limit piece into a slot of the functional module, or to separate the limit piece from the slot of the functional module. The linkage piece further configured to drive the limit piece to move along a second direction to drive the functional module to at least partially slide out of the mounting area when the limit piece is in the slot of the functional module.

16 Claims, 14 Drawing Sheets

(56) References Cited

U.S. PATENT DOCUMENTS

| | | | |
|---|---|---|---|
| 6,771,496 B1* | 8/2004 | Wu | G06F 1/187 108/109 |
| 7,428,147 B2* | 9/2008 | Lin | G11B 33/128 |
| 7,495,908 B2* | 2/2009 | Zhang | G11B 33/123 361/679.33 |
| 8,289,691 B2* | 10/2012 | Peng | G11B 33/127 361/747 |
| 8,355,256 B2* | 1/2013 | Peng | G06F 1/187 235/441 |
| 9,521,774 B2* | 12/2016 | Liang | H05K 7/1415 |
| 10,645,835 B1* | 5/2020 | Sauer | H05K 7/1461 |
| 2001/0008812 A1* | 7/2001 | Nishioka | G06K 13/0856 439/157 |
| 2002/0004327 A1* | 1/2002 | Nishioka | G06K 13/08 439/159 |
| 2004/0179333 A1* | 9/2004 | Xu | G06F 1/184 361/679.39 |
| 2005/0078445 A1* | 4/2005 | Chen | G06F 1/184 361/679.31 |
| 2005/0116135 A1* | 6/2005 | Peng | G11B 33/124 |
| 2005/0121581 A1* | 6/2005 | Chen | G06F 1/184 |
| 2005/0195564 A1* | 9/2005 | Peng | G06F 1/187 361/679.01 |
| 2006/0034048 A1* | 2/2006 | Xu | G06F 1/187 |
| 2007/0235625 A1* | 10/2007 | Liang | G06F 1/187 |
| 2007/0274034 A1* | 11/2007 | Yang | G06F 1/187 720/601 |
| 2009/0294611 A1* | 12/2009 | Tsai | H05K 7/023 248/220.21 |
| 2012/0242203 A1* | 9/2012 | Gong | G06F 1/187 312/223.2 |
| 2015/0049429 A1* | 2/2015 | Zhu | G06F 1/187 361/679.39 |
| 2021/0153372 A1* | 5/2021 | Sung | H05K 7/1418 |
| 2021/0153373 A1* | 5/2021 | Chen | H05K 7/02 |
| 2021/0324911 A1* | 10/2021 | Hsieh | H05K 7/02 |
| 2022/0007534 A1* | 1/2022 | Wang | H05K 7/1487 |

* cited by examiner

FUNCTIONAL MODULE SECURING DEVICE AND DATA PROCESSING EQUIPMENT

CROSS-REFERENCE TO RELATED APPLICATION(S)

This application claims the benefit of and priority to Chinese Patent Application Serial No. 202310316317.5, filed on Mar. 28, 2023, at China's National Intellectual Property Administration, the contents of which are hereby incorporated herein fully by reference.

FIELD

The subject matter herein generally relates to functional modules of computer equipment technologies, and particularly to a functional module securing device and a data processing equipment.

BACKGROUND

In data processing equipment, it is usually necessary to install functional modules, such as expansion cards, for storing and reading data. In the related art, the expansion card is installed in the data processing equipment through fasteners such as screws, which is inconvenient to install or disassemble the functional module.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, the reference numerals designate corresponding parts throughout the several views.

DETAILED DESCRIPTION

Figure 1:
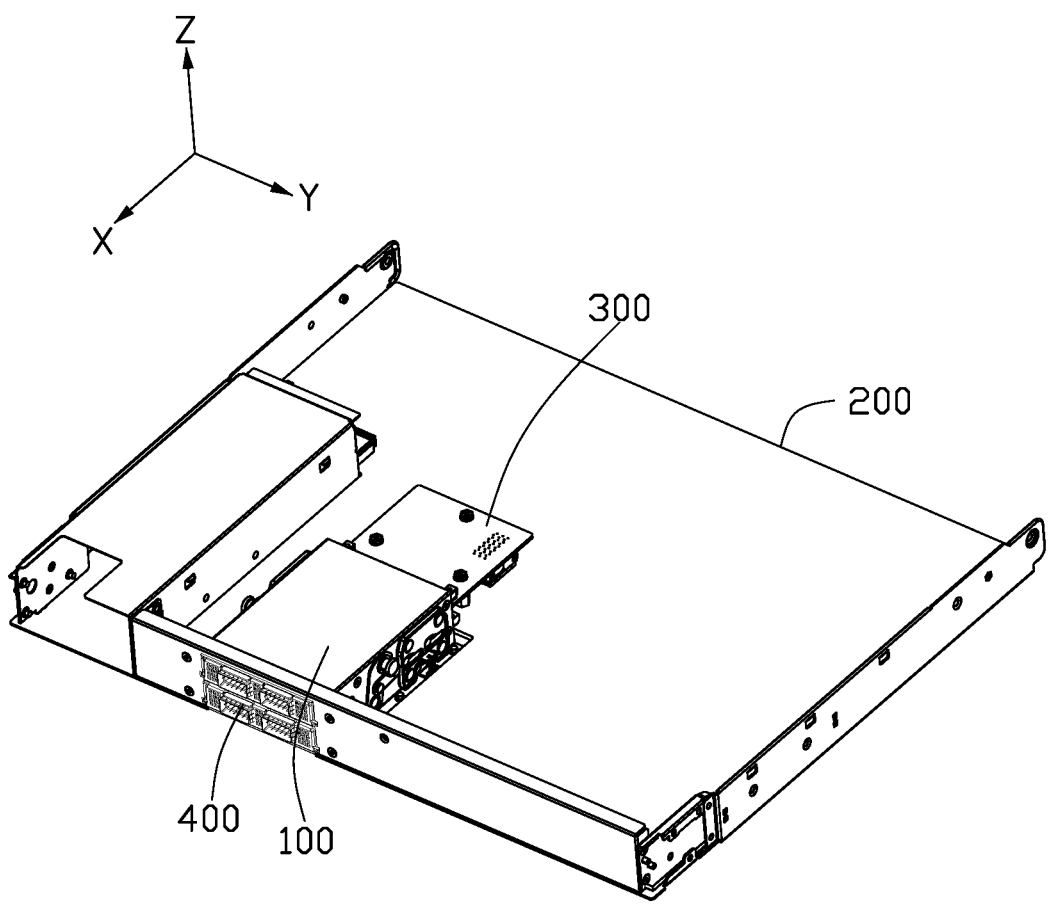
FIG. 1 is a three-dimensional structure diagram illustrating a data processing equipment, according to an example embodiment of the present application.

Implementations of the disclosure will now be described, by way of embodiments only, with reference to the drawings. The disclosure is illustrative only, and changes may be made in detail within the principles of the present disclosure. It may, therefore, be appreciated that the embodiments may be modified within the scope of the claims.

Unless otherwise defined, all technical terms used herein have the same meaning as commonly understood by one of ordinary skill in the art. The technical terms used herein are to provide a thorough understanding of the embodiments described herein but are not to be considered as limiting the scope of the embodiments.

Several definitions that apply throughout this disclosure will now be presented.

The term "coupled" is defined as connected, whether directly or indirectly through intervening components, and is not necessarily limited to physical connections. The term "substantially" is defined to be essentially conforming to the particular dimension, shape, or other word that the term modifies, such that the component need not be exact. The term "comprising," when utilized, means "including, but not necessarily limited to", it specifically indicates open-ended inclusion or membership in the so-described combination, group, series, and the like.

It should be noted that when a component is considered to be "connected" to another component, it may be directly connected to the other component or there may be an intervening component at the same time. When a component is said to be "set on" another component, it can be set directly on the other component or there may be an intervening component at the same time. The terms "top", "bottom", "upper", "lower", "left", "right", "front", "rear", and similar expressions are used herein for the purpose of description only.

When two elements (planes, lines) are arranged in parallel, it should be understood that the relationship between the two elements includes two types: parallel and substantially parallel. Wherein, approximately parallel should be understood to mean that there may be a certain angle between the two elements, and the angle of the included angle is greater than 0° and less than or equal to 10°.

When two elements (planes, lines) are arranged vertically, it should be understood that the relationship between the two elements includes two types: vertical and substantially vertical. Wherein substantially perpendicular should be understood as the angle between two elements is greater than or equal to 80° and less than 90°.

When a parameter is greater than, equal to or less than a certain endpoint value, it should be understood that the endpoint value allows a tolerance of ±10%. For example, A is greater than B by 10, which should be understood as including the case where A is greater than B than 9, including A The case where the ratio B is greater than 11.

Unless otherwise defined, all technical and scientific terms used herein have the same meaning as commonly understood by one of ordinary skill in the technical field to which this application belongs. The terms used herein in the specification of the application are only for the purpose of describing specific embodiments, and are not intended to limit the application.

An embodiment of the present application provides a functional module securing device, including a securing rack including a mounting area, the mounting area places a functional module; a limit piece slidably arranged on an exterior of the securing rack and at least partially located in the mounting area; and a linkage piece arranged on the exterior of the securing rack and connected to the limit piece, the linkage piece configured to drive the limit piece to move along a first direction to at least partially insert the limit piece into a slot of the functional module, or to separate the limit piece from the slot of the functional module, the linkage piece configured to drive the limit piece to move along a second direction to drive the functional module to at least partially slide out of the mounting area when the limit piece is in the slot of the functional module.

The functional module securing device provided by the embodiment of the present application drives the sliding rack to move along the second direction by the rotation handle and the rod. When the slide rack moves along in the second direction move, the connecting rack may synchronously move along with the slide rack, through the action of the guide portion and the elastic piece, the connecting rack may move along the first direction during moving along the second direction. So, the hook arranged on the connecting rack may move along the first direction and the second direction. The hook moving along the first direction may insert into the slot of the functional module or extract from the slot of the functional module. When the hook inserts into the slot of the functional module, the hook may limit the position of the functional module, or through the hook moving along the second direction, the hook may drive the functional module to partially slide out of the mounting area. When the hook separates from the slot, the hook may extract the functional module using the position limitation to the functional module. Through the functional module directly inserting into the mounting area and the hook inserting into the slot of the functional module, the functional module may be mounted successfully. The mounting and dissembling process of the functional module is simple and fast, no additional tools are required, the server does not need to be disassembled, and the operation efficiency can be improved.

Some embodiments of the present application will be described below with reference to the accompanying drawings. In the case of no conflict, the following embodiments and features in the embodiments can be combined with each other.

Figure 2:
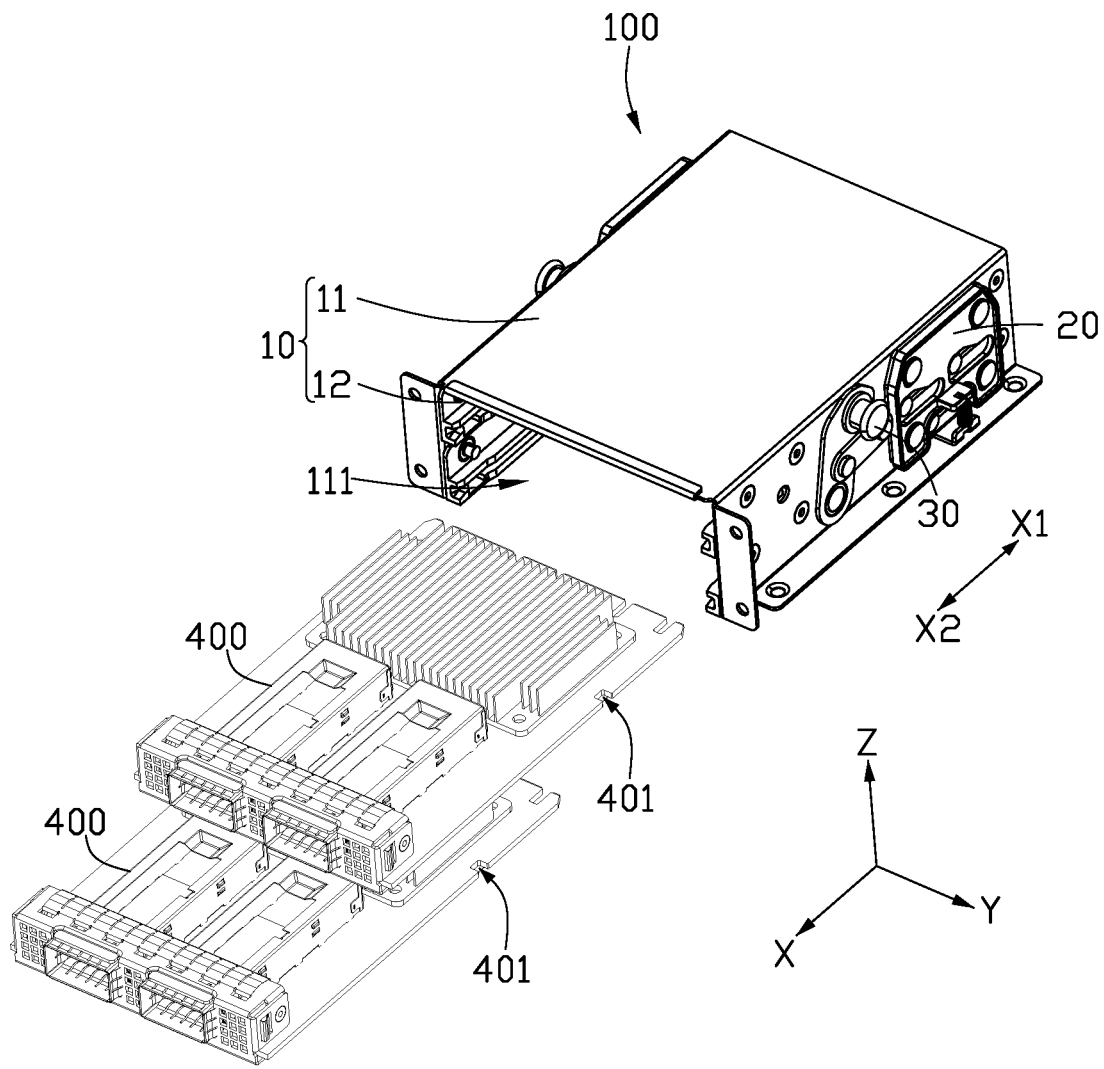
FIG. 2 is an exploded diagram illustrating a functional module and a functional module securing device, according to an example embodiment of the present application.

FIGS. 1 and 2 are schematic diagrams illustrating a functional module securing device 100, according to an example embodiment of the present application. The functional module securing device 100 is applied in a data processing equipment 001 and is capable of conveniently securing and disassembling a functional module 400.

Optionally, in some embodiments, the functional module 400 includes an expansion card module, which is mainly configured to improve or strengthen performance of the data processing equipment 001, such as an expansion card of a computer or a server. The expansion card may be integrated with several functions, such as data storage function or data processing function.

Optionally, in some embodiments, the functional module 400 further includes a data storage module, mainly configured to store data and information, such as a hard disk, a CD-ROM driver, a floppy disk. The hard disk includes but is not limited to IDE (Integrated Drive Electronics) hard disk, SATA (Serial Advanced Technology Attachment) hard disk, SCSI (Small Computer System Interface) hard disk, etc.

Optionally, in some embodiments, the data processing equipment 001 includes a computer or a server.

In order to more clearly describe the technical solutions of the various embodiments of the present application, a coordinate system has been established in the figures, and subsequent descriptions about the various orientations of the functional module securing device 100 are carried out based on the coordinate system. In this coordinate system, a first direction Z extends along a Z-axis direction, a second direction X extends along an X-axis direction, and a third direction Y extends along a Y-axis direction. The first direction Z is perpendicular to a plane formed by the second direction X and the third direction Y, and the second direction X is perpendicular to the third direction Y. In the embodiments of the present application, descriptions about directions such as "up" and "down" are all relative to the first direction Z. In addition, for ease of description, the functional module 400 shown in the figures is an example of an expansion card module, and the data processing equipment 001 shown in the figures is a server.

It can be understood that the first direction Z, the second direction X, and the third direction Y all have two relative orientations in the coordinate system, for example, an installation direction of the functional module 400 is installed in the functional module fixing device 100 along the second direction X, a sliding direction of the functional module 400 may be sliding out from the functional module fixing device 100 along the second direction X at the same time. Therefore, the first direction Z includes an upward direction and a downward direction, and the second direction X includes an insertion direction X1 and an extraction direction X2 of the functional module 400.

It can be understood that, in the embodiments of the application, the first direction Z, the second direction X, and the third direction Y are respectively corresponding to the X axis, the Y axis, and the Z axis, just for the convenience of describing the technical solution, and do not represent is a protection scope, for example, the first direction Z may not extend along the Z axis, but has an included angle greater than 0° with the Z axis, such as 5°, 10°, and so on.

The functional module 400 includes at least one slot 401. The slot 401 is penetrating the functional module 400 along the first direction Z, the slot 401 is on a side of the function module 400 that parallel with the second direction X. Optionally, the functional module 400 may include two slots 401 positioned on two opposite sides of the function module 400. It can be understood that when the functional module 400 is a data storage module such as a hard disk, due to the specification limitation of the hard disk, when it is inconvenient to set the slot 401 penetrating along the first direction Z, a connection structure, such as a bracket can be added on both sides of the hard disk, and the bracket is provided with a slot 401 to realize the connection between the hard disk and the data processing equipment 001.

Figure 3:
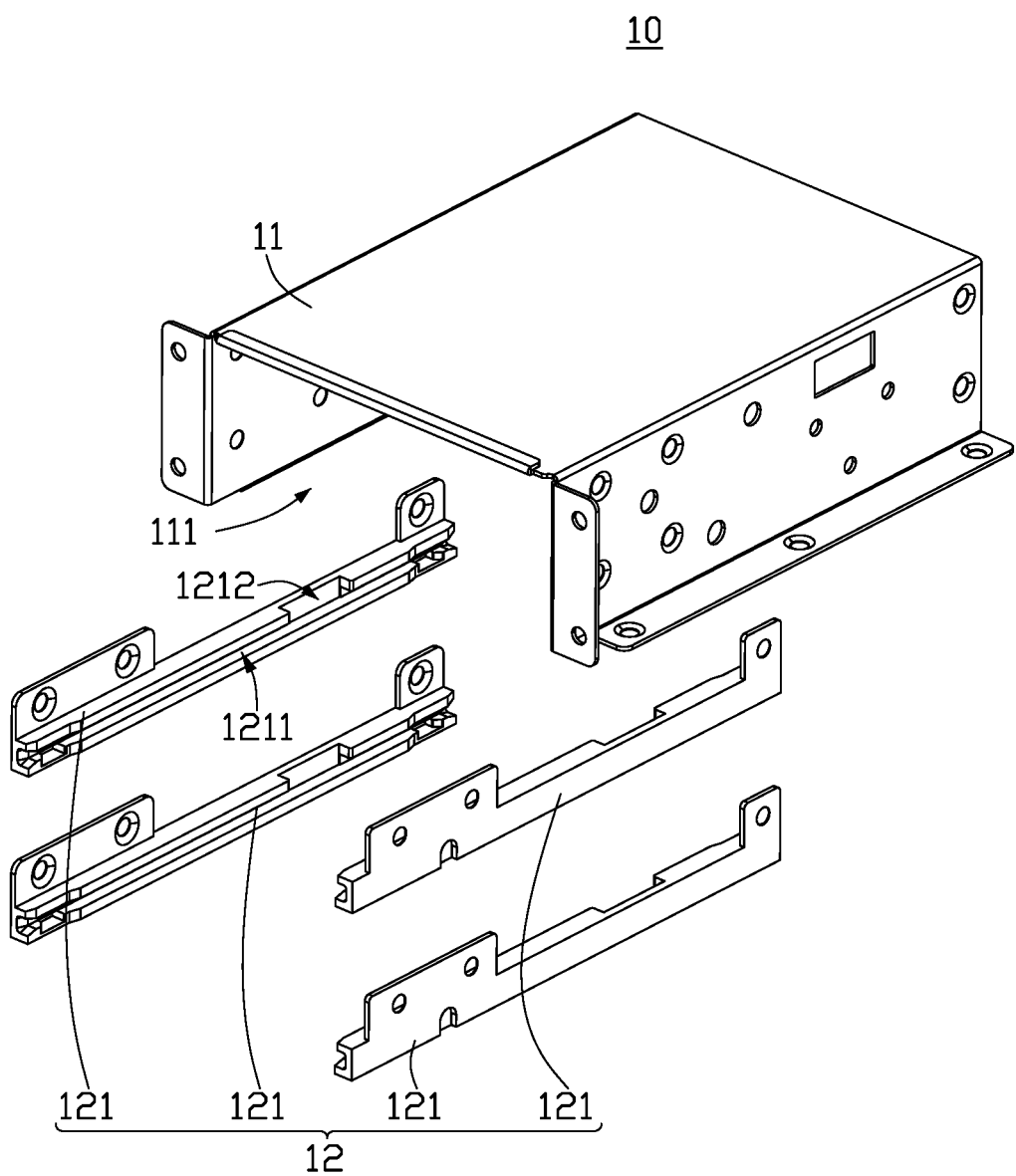
FIG. 3 illustrates an exploded diagram of a securing rack in FIG. 1.
Figure 4:
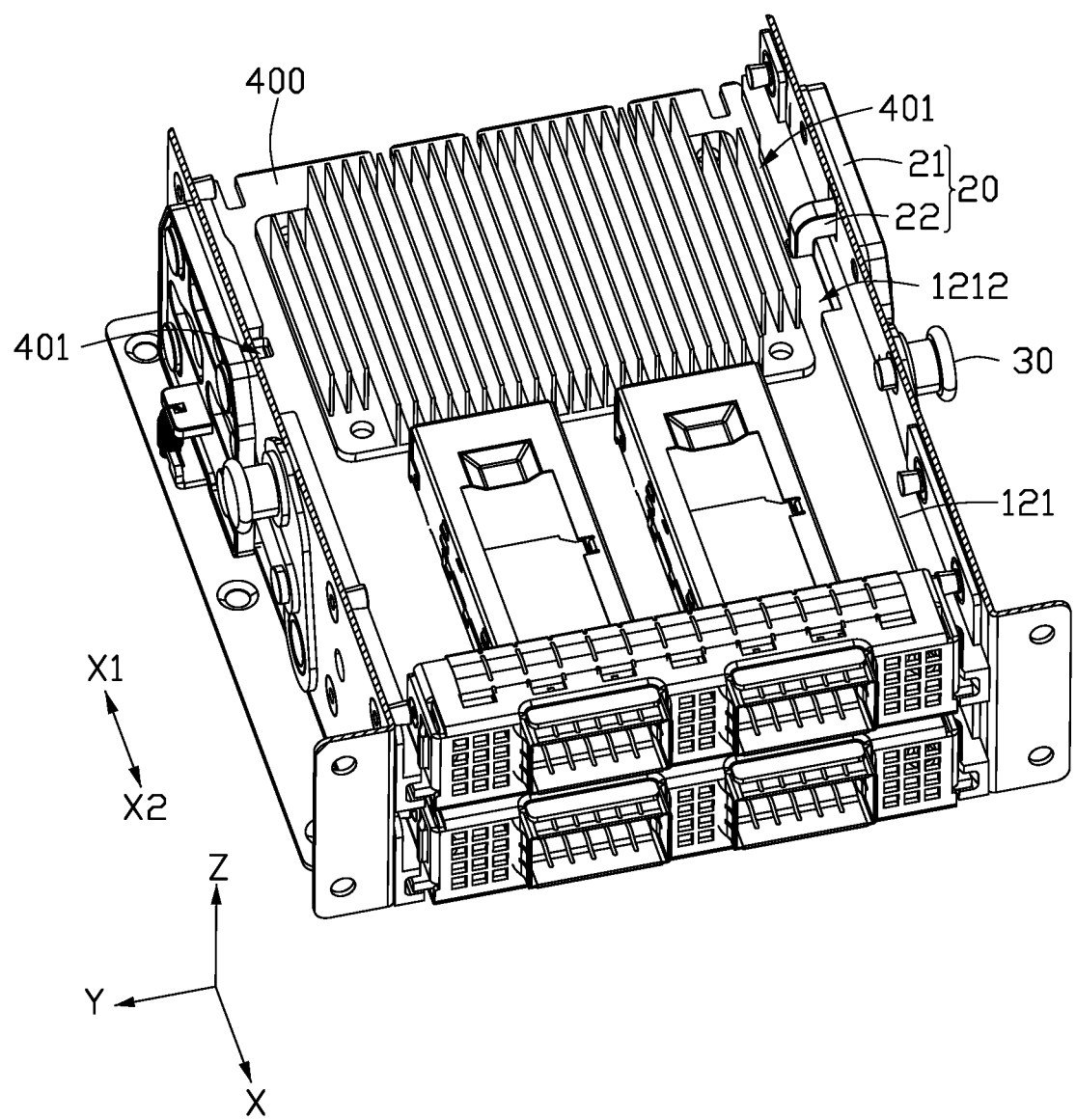
FIG. 4 is a three-dimensional structure diagram illustrating the functional module securing device when a hook is inserted into a slot of the functional module in FIG. 1.

Referring to FIGS. 3 and 4, the functional module securing device 100 includes a securing rack 10, a limit piece 20, and a linkage piece 30. The securing rack 10 includes a mounting area 111, the functional module 400 is located in the mounting area 111. The limit piece 20 at least partially located in the mounting area 111, a part of the limit piece 20 located in the mounting area 111 may be inserted into the slot 401. The linkage piece 30 is connected to the limit piece 20. The linkage piece 30 is configured to drive the limit piece 20 to move along the first direction Z and the second direction X.

When the functional module 400 needs to be arranged in the mounting area 111, the functional module 400 may be inserted into the mounting area 111 and be connected to an electric component 300, the functional module 400 may drive the limit piece 20 to move along the first direction Z through the linkage piece 30, so the limit piece 20 may insert into the slot 401 for limiting the position of the functional module 400.

When the functional module 400 needs to be pulled out from the mounting area 111, the linkage piece 30 may drive the limit piece 20 to move along the first direction Z, so the limit piece 20 may drive the functional module 400 to move, the functional module 400 may at least partially slide out of the mounting area 111. The linkage piece 30 may drive the limit piece 20 to move along the first direction Z, so the limit piece 20 may be separated from the slot 401, the functional module 400 may be free of the limiting at this time, the functional module 400 may be pulled out by operating the part of the functional module 400 that being out of the mounting area 111.

The functional module 400 may be mounted on the functional module securing device 100 or disassembled from the functional module securing device 100, which has a simple process without any other tools such as a screwdriver.

Further, the data processing equipment 001 is usually arranged in layers during use, and a reserved space is small, the limit piece 20 is driven by the linkage piece 30, and the limit piece 20 drives the functional module 400 to move, and a moving direction of the linkage piece 30 is consistent with a moving direction of the functional module 400, which occupies less space.

The securing rack 10 includes a housing 11 and a guide rail group 12. The mounting area 111 is arranged in the housing 11, the functional module 400 may be inserted into the mounting area 111 though an opening of the mounting area 111. The guide rail group 12 is located in the mounting area 111 and arranged an interior of the housing 11 at intervals along the first direction Z, the guide rail group 12 is extended along the second direction X and engaged with the functional module 400, so the functional module 400 may slide on the guide rail group 12 along the second direction X to insert into or slide out of the mounting area 111.

Optionally, in some embodiments, a quantity of the guide rail group 12 may be two, the two guiding rails 12 are arranged along the first direction Z, so one functional module securing device 100 may secure two functional modules 400, a sliding direction of the functional modules 400 is along the second direction X, each of the functional modules 400 may separately slide out or be mounted without interference. It can be understood that the quantity of guide rail group 12 is not limited to two, and can also be other quantities, such as three, four, five, etc.

Further, since the limit piece 20 may be inserted into the slot 401 of the functional module 400 along the first direction Z, which is consistent with a spacing direction of multiple functional modules 400, in some embodiments, the limit piece 20 can be installed in the slots 401 of the multiple functional modules 400, for simultaneously limiting the multiple functional modules 400 or driving the multiple functional modules 400 to move at the same time.

Optionally, the housing 11 is substantially rectangular, including two side boards and a ceiling board, the ceiling board is positioned between the two side boards, the two side boards are spaced apart from each other, so the two side boards and the ceiling board enclose the mounting area 111. The ceiling board is parallel with a plane formed by the second direction X and the third direction Y, each of the two side boards is parallel with a plane formed by the first direction Z and the second direction X. The guide rail group 12 is arranged on the two side boards.

Optionally, in some embodiments, each guide rail group 12 includes two slide rails 121, the two slide rails 121 are arranged at intervals along the third direction Y, and the functional module 400 is arranged between the two slide rails 121. Each slide rail 121 includes a slide groove 1211, the slide groove 1211 runs through the opposite ends of the slide rail 121 along the second direction X, and the slide groove 1211 runs through the opposite sides of the slide rail 121 and runs through a side of the slide rail 121 close to the functional module 400, and the opposite sides of the functional module 400 are respectively located in two different slide grooves 1211, and may slide under a guidance of the slide grooves 1211.

Optionally, the slide rail 121 includes a limit groove 1212, the limit groove 1212 runs through an upper part of the slide rail 121 and is communicated with the slide groove 1211. The limit piece 20 is configured to insert into the slot 401 of the functional module 400 to partially slide within a range of the limit groove 1212, so as to limit a sliding range of the limit piece 20 and increase a sliding stability. During the sliding process of the limit piece 20, the part of the limit piece 20 located in the mounting area 111 may move into the slide groove 1211 through the limit groove 1212, so as to insert into the slot 401 located in the slide groove 1211.

Figure 5:
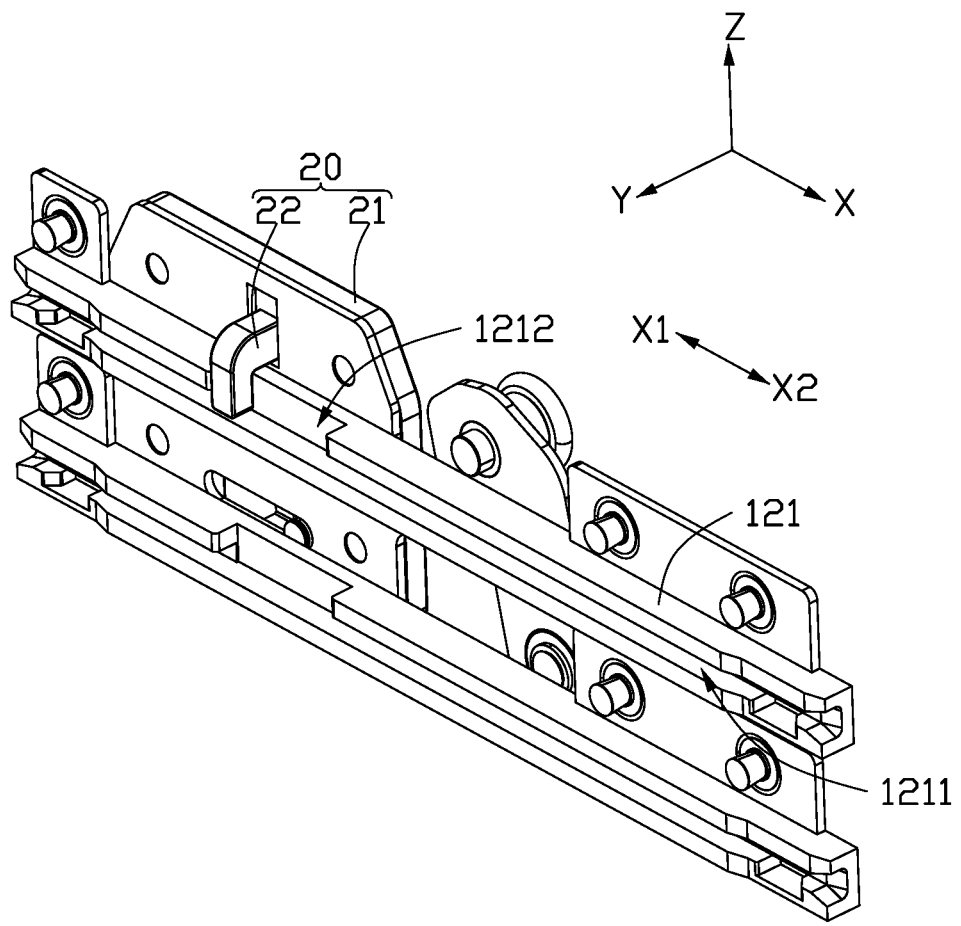
FIG. 5 is a three-dimensional structure diagram illustrating a slide rail, a limit piece, and a linkage piece in FIG. 4.
Figure 6:
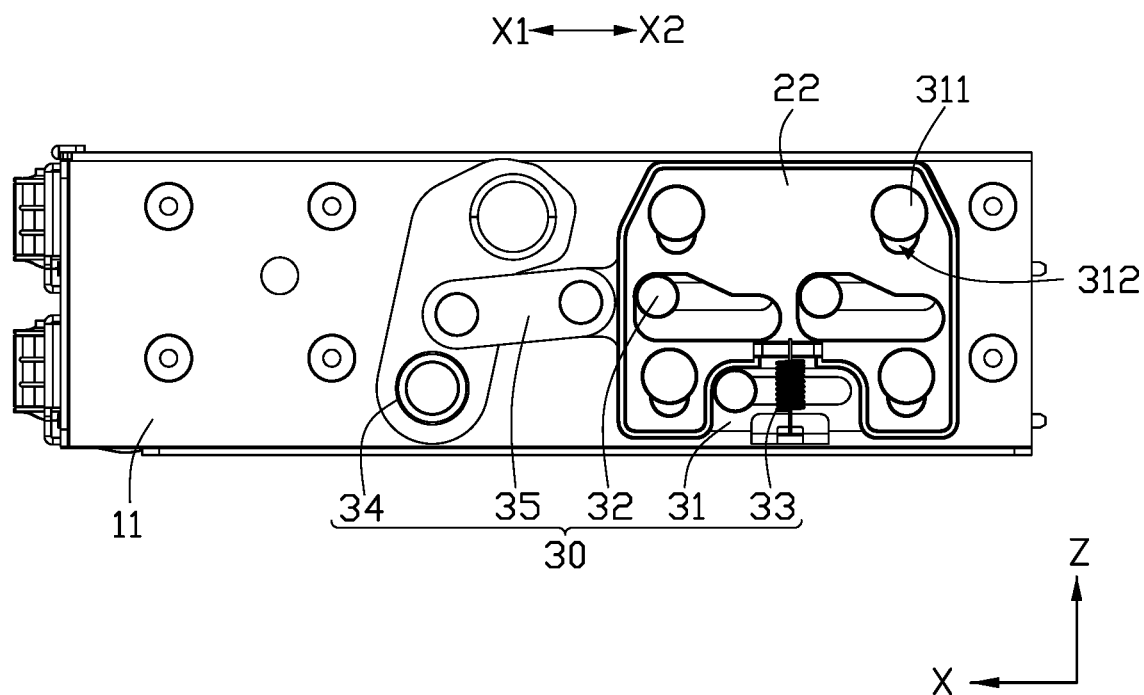
FIG. 6 illustrates a side view of the functional module and the functional module securing device in FIG. 4.
Figure 7:
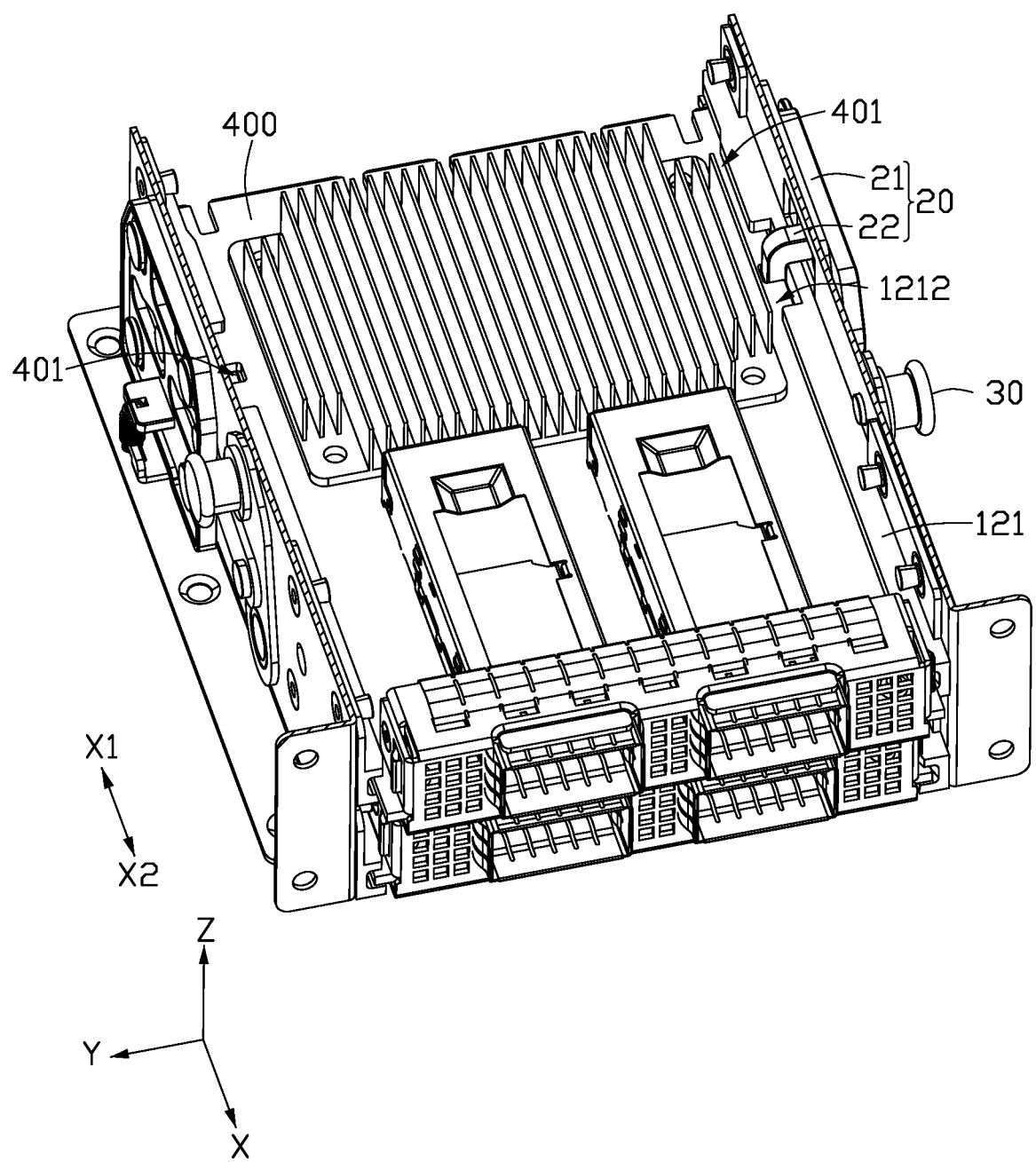
FIG. 7 is a three-dimensional structure diagram illustrating the functional module and the functional module securing device when the hook driving the functional module to move along a pull-out direction, according to an example embodiment of the present application.
Figure 8:
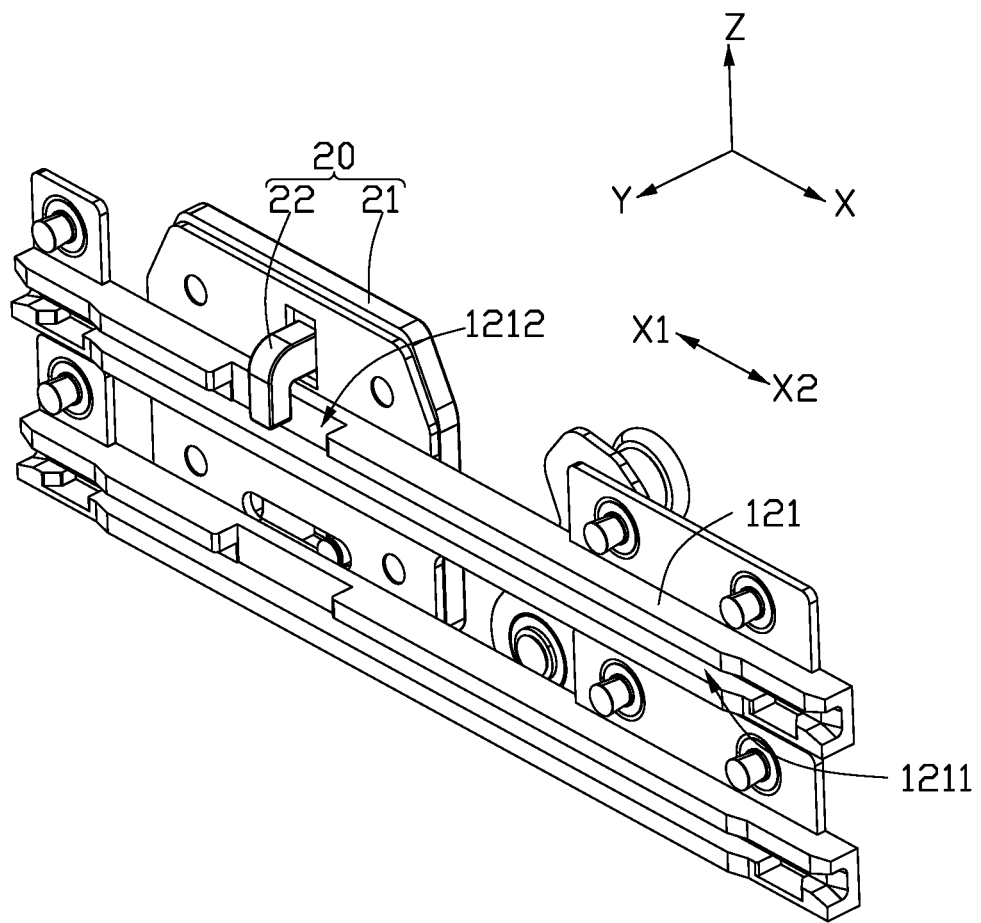
FIG. 8 is a three-dimensional structure diagram illustrating the slide rail, the limit piece, and the linkage piece in FIG. 7.
Figure 9:
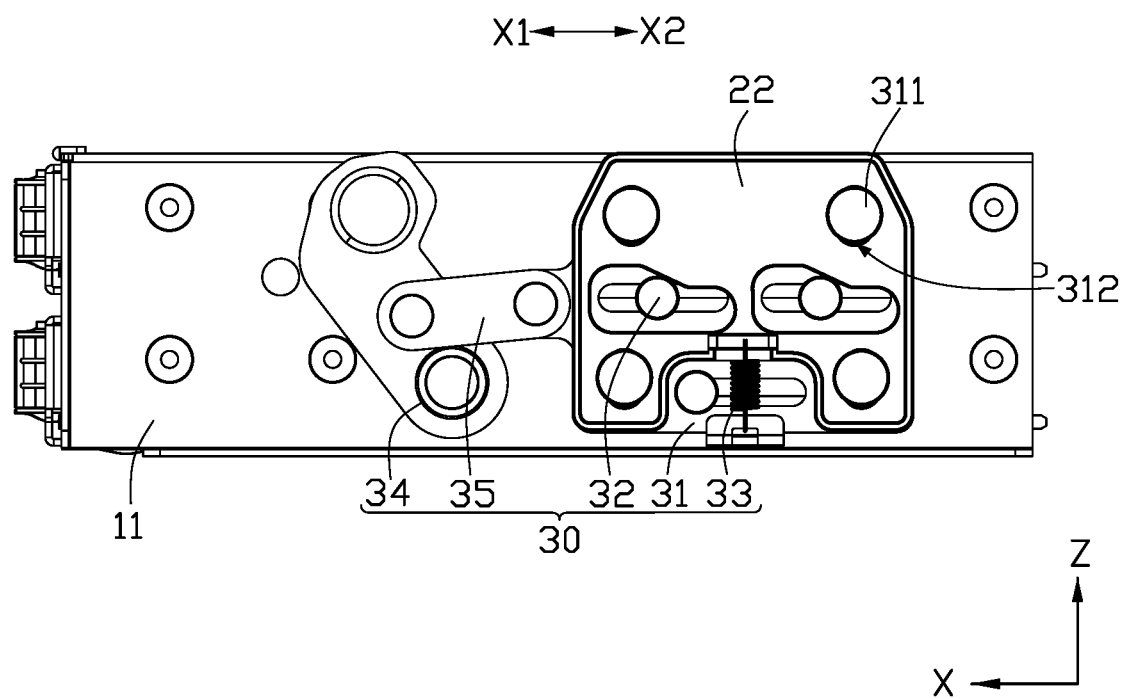
FIG. 9 illustrates a side view of the functional module and the functional module securing device in FIG. 7.
Figure 10:
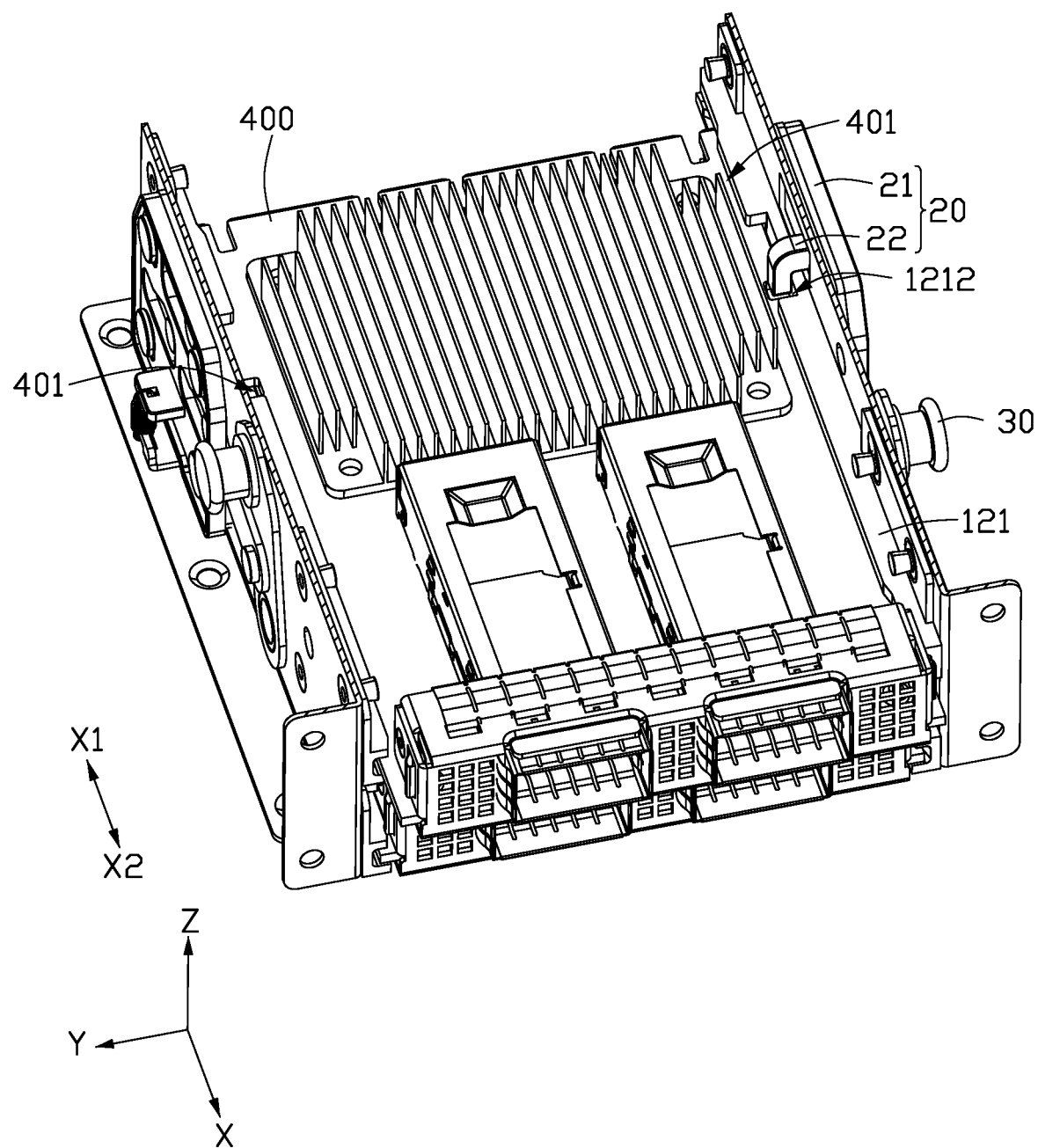
FIG. 10 is a three-dimensional structure diagram illustrating the functional module securing device when the hook is separated from the slot of the functional module in FIG. 4.
Figure 11:
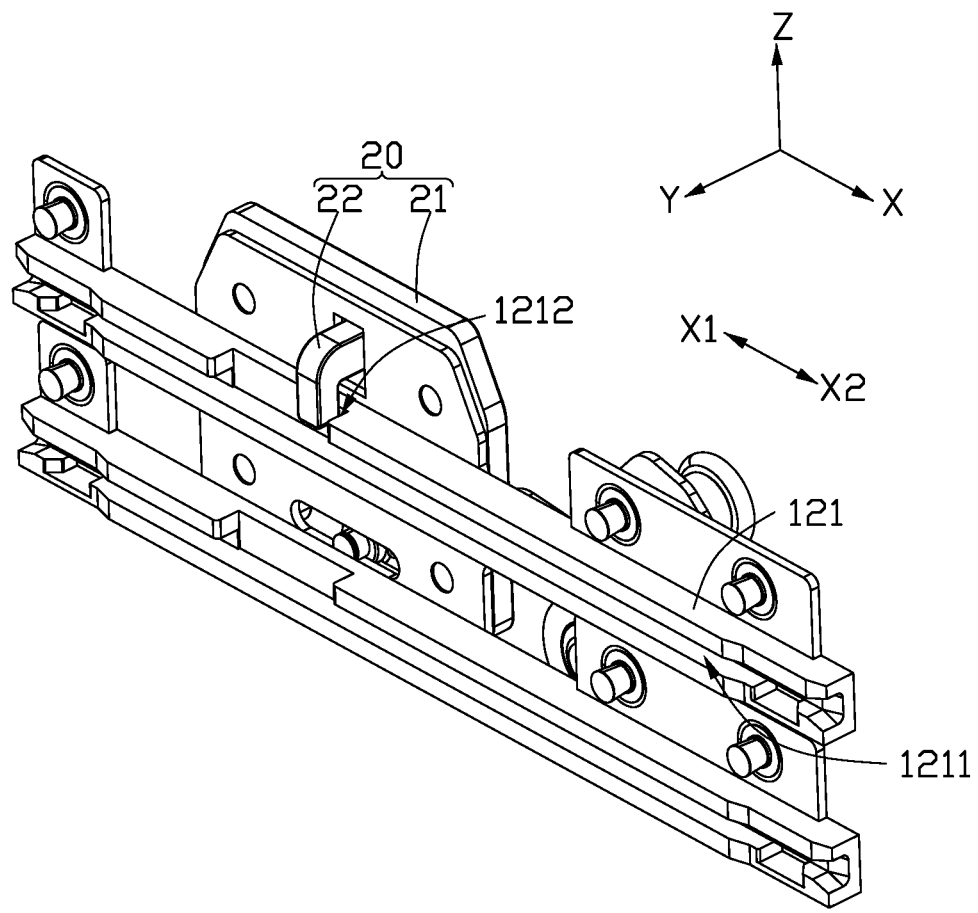
FIG. 11 is a three-dimensional structure diagram illustrating the slide rail, the limit piece, and the linkage piece in FIG. 10.
Figure 12:
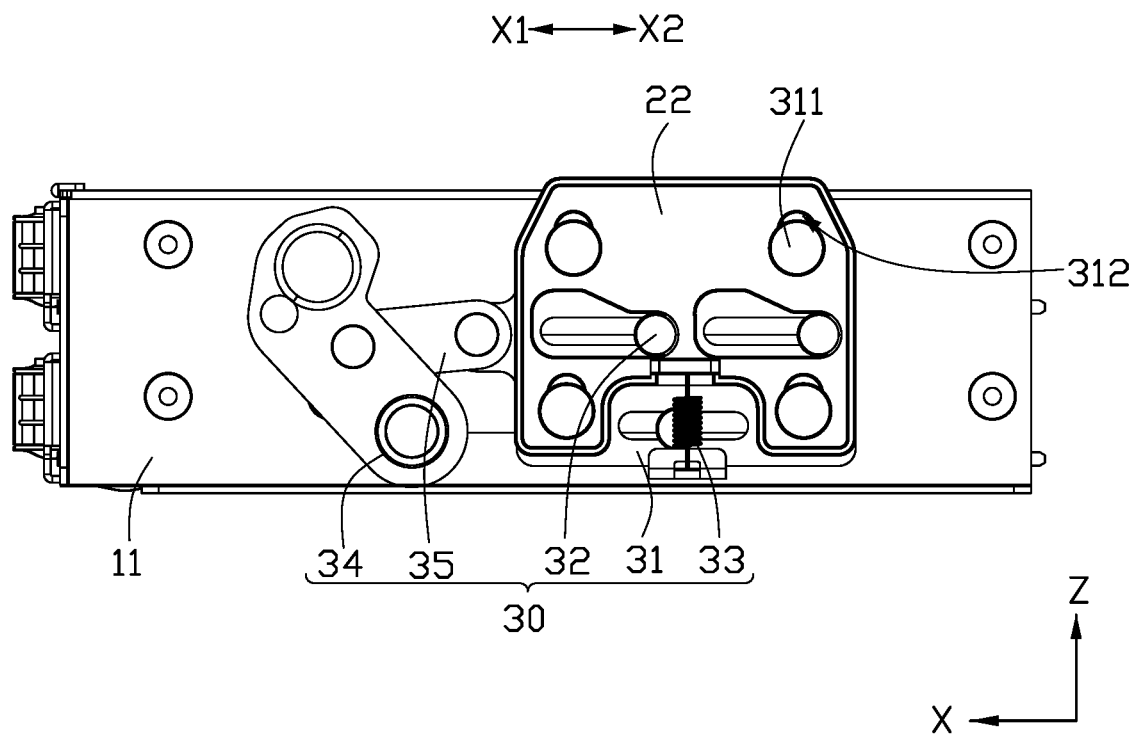
FIG. 12 illustrates a side view of the functional module and the functional module securing device in FIG. 10.

Referring to FIGS. 4 to 12, FIGS. 4 to 6 illustrate the functional module 400 located in the mounting area 111, and a hook 22 is inserted into the slot 401 of the functional module 400. FIGS. 7 to 9 illustrate the hook 22 drives the functional module 400 to move. FIGS. 10 to 12 illustrate the hook 22 separates from of slot 401 of the functional module 400. The limit piece 20 includes a connecting rack 21 and the hook 22. The connecting rack 21 is arranged to an exterior of the housing 11, the connecting rack 21 is connected to the linkage piece 30, so the linkage piece 30 may drive the connecting rack 21 to move. The hook 22 is arranged on the connecting rack 21, the hook 22 may insert into the mounting area 111 through an avoidance groove 112 of the housing 11, the hook 22 is located in the limit groove 1212, the hook 22 may slide along the second direction X and the first direction Z within a range of the limit groove 1212, so the hook 22 may insert into the slot 401 of the functional module 400. Optionally, as mentioned above, the first direction Z has two orientations: upward and downward. The hook 22 can be set to move upwards to insert into the slot 401 of the functional module 400, or the hook 22 can be set to move downwards to insert into the slot 401. For the convenience of subsequent description, the embodiment of the present application takes the hook 22 moving downwards to insert into the slot 401 as an example.

Optionally, the hook 22 may be substantially L-shaped, one end of the hook 22 may be connected to the connecting rack 21, another end of the hook 22 may bent downwardly and insert into the slot 401 of the functional module 400.

Figure 13:
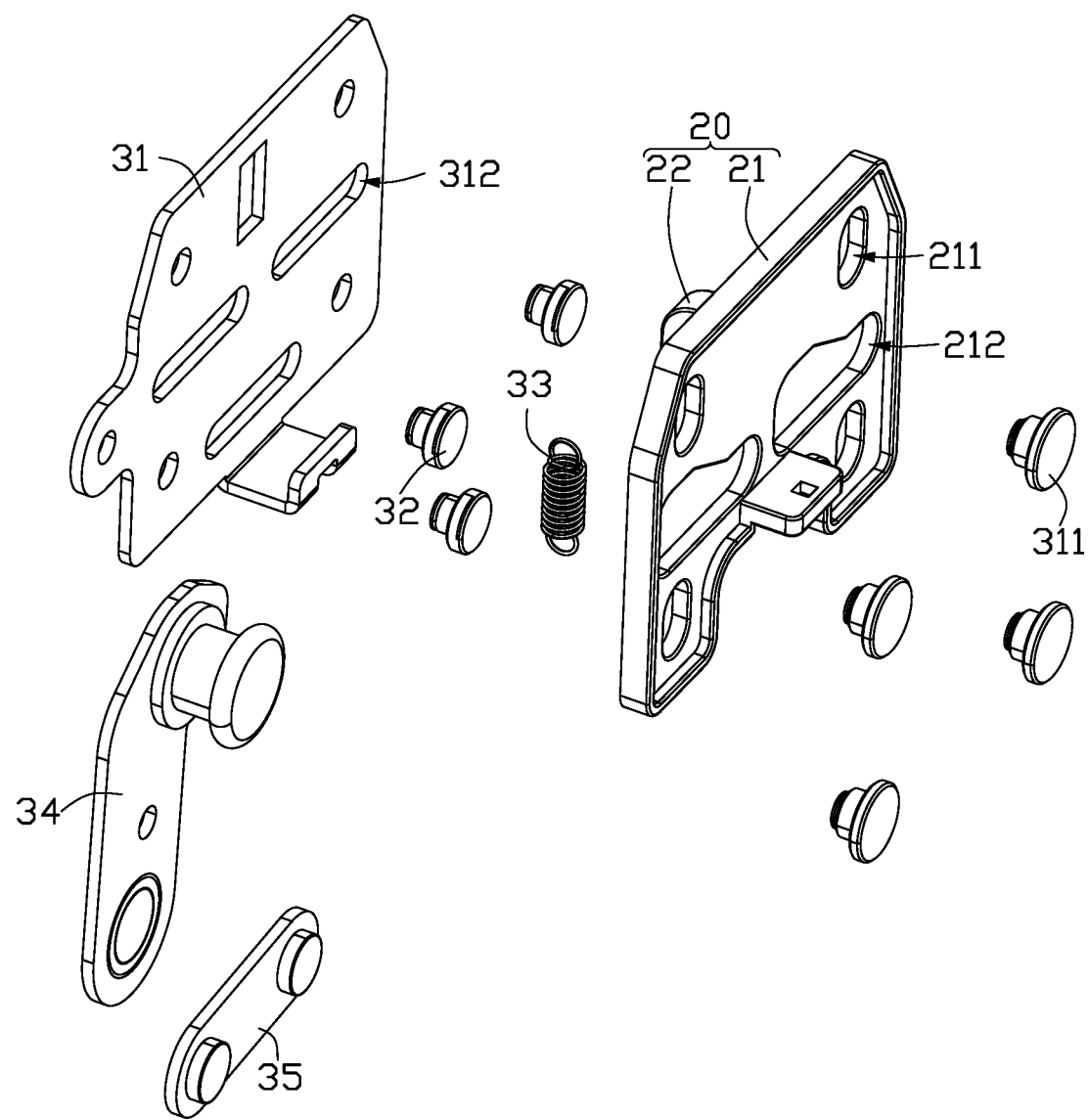
FIG. 13 illustrates an exploded diagram of the limit piece and the linkage piece in FIG. 1.

Referring to FIG. 13, optionally, in some embodiments, the linkage piece 30 includes a slide rack 31 and a guide portion 32. The slide rack 31 is slidably arranged to a side of the housing 11 along the second direction X, the connecting rack 21 is slidably arranged to a side of the slide rack 31 that away from the housing 11 along the first direction Z, so when the slide rack 31 moves along the second direction X, the slide rack 31 may drive the connecting rack 21 to move along the second direction X. The guide portion 32 may be arranged on a side of the housing 11 and engage with the connecting rack 21, so the connecting rack 21 may move along the first direction Z when sliding along the second direction X.

Since the connecting rack 21 moves along the second direction X, the connecting rack 21 can move along the first direction Z under an action of the guide portion 32, thereby driving the hook 22 to insert into the slot 401 of the functional module 400 or separate from the slot 401, through the slide rack 31 sliding along the second direction X, the limit piece 20 can be driven to move along the first direction Z and the second direction X, which can simplify the operation and facilitate the assembling and disassembling of the functional module 400.

In order to allow the connecting rack 21 to slide relative to the slide rack 31 along the first direction Z, optionally, in some embodiments, along the third direction Y, the slide rack 31 roughly overlaps with the connecting rack 21, and the slide rack 31 is provided with a guide post 311, the guide post 311 is fixed on the side of the connecting rack 21 away from the housing 11. The connecting rack 21 includes a slide slot 211, the guide post 311 runs through the slide slot 211, a length of the guide post 311 along the first direction Z is greater than a diameter of the guide post 311, which may be convenient for the guide post 311 sliding relative to the slide slot 211 along the first direction Z. A width of slide slot 211 along the second direction X is adaptive to the diameter of the guide post 311, so the guide post 311 may drive the connecting rack 21 to move when guide post 311 is moving along the second direction X. Optionally, a structure of each of the slide rack 31 and the connecting rack 21 is substantially rectangular sheet.

By the overlapping arrangement of the slide rack 31 and the connecting rack 21, an occupied area on the second direction X can be reduced, because the slide rack 31 and the connecting rack 21 both slide along the second direction X, and the slot 401 of a part of the functional modules 400 is adjacent to the opening of the mounting area 111, if the occupied area on the second direction X is too large, it is possible that there is not enough space for the hook 22 to insert into the slot 401 of the functional module 400.

It can be understood that the positions of the guide post 311 and the slide slot 211 can be replaced with each other, that is, the guide post 311 is set on the connecting rack 21, and the slide slot 211 is set on the slide rack 31. The guide post 311 is substantially a cylinder. In other embodiments, the guide post 311 may also be a rectangle, a pentagon, and the like.

Figure 14:
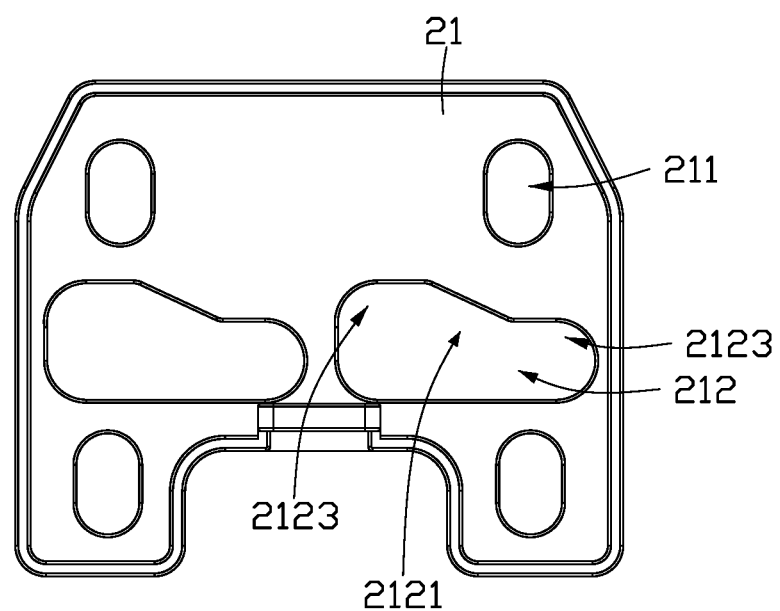
FIG. 14 illustrates a side view of the limit piece in FIG. 1.

Referring to FIG. 14, in order to allow the slide rack 31 to slide along the second direction X, and during the sliding process of the slide rack 31, the connecting rack 21 can slide relative to the slide rack 31 along the first direction Z. In some embodiments, the connecting rack 21 is provided with a first guide groove 212, and the first guide groove 212 has a guide surface 2121. The slide rack 31 defines a second guide groove 312. The guide portion 32 fixed on one side of the housing 11 is passed through the second guide groove 312 and located in the first guide groove 212, the guide post 311 is in contact with the guide surface 2121.

A width of the second guide groove 312 along the first direction Z is approximately the same as a diameter of the guide portion 32, and a length of the second guide groove 312 along the second direction X is greater than the diameter of the guide portion 32, so that the slide rack 31 can move along the second direction X.

Along the first direction Z and the second direction X, a width and a length of the first guide groove 212 are greater than that of the guide portion 32, so that the connecting rack 21 has enough space to move along the first direction Z and the second direction X. The guide surface 2121 in contact with the guide portion 32 is inclined, and the inclined direction is: along the insertion direction X1 of the functional module 400, the guide surface 2121 is inclined toward the direction in which the limit piece 20 inserts into the slot 401 of the functional module 400, that is the guide surface 2121 is inclined downwardly.

When the guide portion 32 is in contact with an upper side of the guide surface 2121, the connecting rack 21 can move upwards relative to the slide rack 31, and the hook 22 is located in the slot 401. When the slide rack 31 drives the connecting rack 21 to move along the extraction direction X2 of the functional module 400, the connecting rack 21 not only moves in the extraction direction X2 of the functional module 400, but also moves upwardly by a lifting of the guide portion 32, so the hook 22 can drive the functional module 400 out of the mounting area 111, and during the process of the hook 22 driving the functional module 400 to move, the hook 22 gradually moves upward until the hook 22 separates from the slot 401 of the functional module 400, so as to release the limitation of the functional module 400, so that the functional module 400 can be pulled out directly after at least partly protruding from the mounting area 111.

Through the guide portion 32 running through the first guide groove 212 and the second guide groove 312, the slide rack 31 can stably slide along the second direction X, and the connecting rack 21 can be driven to move upward during the sliding process of the slide rack 31, the structure is simple, and the guide portion 32 may have multiple functions, the design of which is ingenious.

It should be known that a quantity of each of the first guide groove 212, the second guide groove 312, and the guide portion 32 is not limited, for example, there may be three first guide grooves 212, three second guide grooves 312, and three guide portions 32, and they are corresponded one by one. There may be two first guide grooves 212, three guide portions 32, and three second guide grooves 312, one guide portion 32 only passes through one second guide groove 312. Each first guide groove 212 does not necessarily have the guide surface 2121, at least one of the plurality of first guide grooves 212 has the guide surface 2121. In other embodiments, the connecting rack 21 may not be provided with the first guide groove 212, but the guide surface 2121 is formed by a shape of the connecting rack 21.

Optionally, in some embodiments, the linkage piece 30 further includes an elastic piece 33. One end of the elastic piece 33 is connected to the slide rack 31, another end of the elastic piece 33 is connected to the connecting rack 21 of the limit piece 20. When the guide portion 32 is in contact with a lower side of the guide surface 2121 to lift the connecting rack 21, the connecting rack 21 stretches the elastic piece 33, so that the elastic piece 33 applies a force in a direction of the hook 22 inserting into the slot 401 to the connecting rack 21, that is, the elastic piece 33 applies a downward force to the connecting rack 21. When the sliding rack 31 drives the connecting rack 21 to move along the insertion direction X1 of the functional module 400, the connecting rack 21 can move downwards under the pull of the elastic piece 33, so that the hook 22 can insert into the slot 401. The pull force of the elastic piece 33 can make the hook 22 automatically insert into the slot 401 of the functional module 400, which limits the position of the functional module 400 by a simple way, and improves the stability of the hook 22. Optionally, the elastic piece 33 may be a spring.

It can be understood that, in other embodiments, the elastic piece 33 may not be provided, for example, the hook 22 can be inserted into the slot 401 of the functional module 400 under a gravity action of the limit piece 20. For another example, magnets that can attract each other are set on both of the connecting rack 21 and the slide rack 31, and a downward force is applied to the connecting rack 21 through the adsorption of the magnets.

Optionally, in some embodiments, the first guide groove 212 further includes a first plane 2122 and a second plane 2123. Both of the first plane 2122 and the second plane 2123 are connected to the guide surface 2121, the guide surface 2121 may be positioned between the first plane 2122 and the second plane 2123. Both of the first plane 2122 and the second plane 2123 are planes that parallel with the second direction X, the first plane 2122 is higher than the second plane 2123. When the guide portion 32 is in contact with the first plane 2122, the hook 22 inserts into the slot 401 of the functional module 400. When the guide portion 32 is in contact with the second plane 2123, the guide portion 32 lifts the connecting rack 21, the hook 22 is beyond the slot 401 of the functional module 400.

Since when the elastic piece 33 is stretched, it will apply a downward force on the connecting rack 21, if the guide portion 32 does not include the first plane 2122 and the second plane 2123, and the guide portion 32 only in contact with the guide surface 2121, through the guide surface 2121 being inclined, the connecting rack 21 may also receive a force in the insertion direction X1 of the functional module 400 besides receiving the downward force, so that the connecting rack 21 may automatically move toward the insertion direction X1 of the functional module 400 and move downward. That is, when the sliding rack 31 is manually moved to separate the hook 22 from the slot 401 of the functional module 400, and after the functional module 400 is extracted, if the force applied manually to the sliding rack 31 is released, the connecting rack 21 will move toward the insertion direction X1 of the function module 400 and downwards, under the action of the elastic piece 33. If insertion of the functional module 400 is needed at this time, sliding the sliding rack 31 again, and keeping the position of the slide rack 31 stable so that the hook 22 will not interfere with the functional module 400, and then the functional module 400 can be inserted.

By providing the second plane 2123, when the guide portion 32 lifts the connecting rack 21 to separate the hook 22 from the slot 401 of the functional module 400, the guide portion 32 contacts the second plane 2123, and the force between the second plane 2123 and the guide portion 32 is a force along the first direction Z, and no separation occurs. Therefore, the position of the connecting rack 21 can be kept stable, and no interference will occur when the functional module 400 is inserted into the mounting area 111. Installation of the functional module 400 is easier and simpler through the second plane 2123.

Optionally, in some embodiments, the linkage piece 30 further includes a rotation handle 34 and a rod 35. One end of the rotation handle 34 is rotatably connected to the housing 11, another end of the rotation handle 34 is for being held by the user, so the rotation handle 34 may be rotated. A rotation axis of the rotation handle 34 extends along the third direction Y, so that when the rotation handle 34 rotates, positions of the first direction Z and the second direction X may change. One end of the rod 35 is rotatably connected to the rotation handle 34, another end of the rod 35 is rotatably connected to the slide rack 31, through the rotation of the rotation handle 34, the connecting rack 21 may be driven to move along the second direction X. A distance between a conjunction of the rod 35 and the rotation handle 34 and a rotation spot of the rotation handle 34 is less than a distance between opposite ends of the rotation handle 34. That is, a force arm at a hold spot of the user is longer, and it can save more effort by the rotation handle 34 driving the slide rack 31 to move. Since an internal structure of the data processing equipment 001 is complex and the data processing equipment 001 is usually stacked in the chassis when working, the space for the mounting and disassembling of the functional module 400 is limited, and it is also inconvenient to apply force, by setting the rotation handle 34, it can reduce the force required to partially extract the functional module 400 out of the mounting area 111, and since the functional module 400 needs to be inserted and extracted at the opening of the mounting area 111, space is generally reserved and the force arm of the rotation handle 34 is long, so the rotation handle 34 can be made closer to the opening of the mounting area 111, so as to be conveniently held by the user.

Taking the illustrated structures in the figures as an example, the mounting and dissembling process of the functional module 400 will be described. It can be understood that this is only the mounting and dissembling process of the functional module 400 in one embodiment of the present application, and it is only for convenience understanding this scheme, which does not represent the entire protection scope of this application.

When dissembling the functional module 400, referring to FIGS. 4, 5, and 6, the hook 22 is in a first position at this time, when the hook 22 is in the first position, if the functional module 400 is located in the mounting area 111, the hook 22 may be located in the slot 401 of the functional module 400 (as shown in FIGS. 4 and 6).

Referring to FIGS. 7, 8, and 9, the hook 22 is in a second position at this time, when the hook 22 moves from the first position to the second position, the functional module 400 may be partially extracted. A process of the hook 22 moves from the first position to the second position may be: the rotation handle 34 is held by the user and rotates in the extraction direction X2, the rotation handle 34 may drive the rod 35 to move during the rotation, the rod 35 further drives the slide rack 31 to move, the slide rack 31 may move along the extraction direction X2 under the guide of the guide portion 32. The connecting rack 21 also moves along the extraction direction X2 synchronously with the slide rack 31, during the movement of the connecting rack 21, the guide portion 32 gradually transitions from contact with the first plane 2122 to contact with the guide surface 2121, so that the connecting rack 21 moves along the extraction direction X2, and also gradually moves upward. Since the hook 22 is connected to the connecting rack 21, the hook 22 also moves along the extraction direction X2 and upwards with the connecting rack 21, at this time, the hook 22 is in the second position, and the hook 22 is moving along the extraction direction X2, and may drive the functional module 400 to move, so that part of the functional module 400 is located outside the mounting area 111.

Referring to FIGS. 10, 11, and 12, the hook 22 is in the third position at this time, a process of the hook 22 moves from the second position to the third position may be: the user continues to turn the rotation handle 34, and drives the connecting rack 21 to move through the rod 35 and the slide rack 31, the guiding portion 32 transitions from being in contact with the guide surface 2121 to being in contact with the second plane 2123, and the guiding portion 32 no longer lifts the connecting rack 21, at this time, the hook 22 is separated from the slot 401 of the functional module 400. The user may directly extract the functional module 400 by the part of the functional module 400 exposing from the mounting area 111.

When the functional module 400 is needed, the hook 22 is firstly controlled to be in the third position, so that the hook 22 does not interfere with the functional module 400. The functional module 400 is inserted into the mounting area 111, then the rotation handle 34 is rotated toward the insertion direction X1, under the driven of the rod 35, the slide rack 31 moves along the insertion direction X1, the connecting rack 21 moves along the insertion direction X1 together with the slide rack 31, at this time the guide portion 32 gradually apart from the second plane 2123 during the movement process of the connecting rack 21, the guide portion 32 is in contact with the guide surface 2121 under the pull force applied by the elastic piece 33, so the connecting rack 21 moves along the insertion direction X1 and moves gradually downwards, at this time the hook 22 arranged on the connecting rack is in the second position.

It should be known that, if the functional module 400 is directly inserted into the mounting area 111 and connected to the electric component 300, the hook 22 will not drive the functional module 400 to move during the mounting process of the functional module 400. Thus, during the process of the hook 22 moving downward and toward the insertion direction X1, the hook 22 may be resisted to the surface of the functional module 400 and stop sliding downward but only move along the insertion direction X1 until the hook 22 moves to the corresponding position of the slot 401 of the functional module 400. The hook 22 moves downward and inserts into the slot 401 of the functional module 400 under the pull force of the elastic piece 33, so as to limit the position of the functional module 400, the hook 22 is in the third position at this time.

When the functional module 400 is located in the mounting area 111 and needs to move a certain distance along the insertion direction X1 to be connected to the electronic component 300, the hook 22 moves downward and toward the insertion direction X1 at the second position, and the hook 22 is inserted into the slot 401 during the movement process, and drives the functional module 400 to move along the insertion direction X1. When the hook 22 moves to the third position, the functional module 400 is connected to the electronic component 300.

An embodiment of the present application further provides the data processing equipment 001 including a mounting housing 200, the functional module securing device 100, and the electronic component 300. The electronic component 300 and the functional module securing device 100 are arranged in the mounting housing 200. The electronic component 300 is on a side of the functional module securing device 100. When the functional module 400 may be connected to the electronic component 300 when being arranged into the functional module securing device 100.

In conclusion, the embodiment of the present application provides the functional module securing device 100 and the data processing equipment 001. Driving the sliding rack 31 to move along the second direction X by the rotation handle 34 and the rod 35. When the slide rack 31 moves along in the second direction Z move, the connecting rack 21 may synchronously move along with the slide rack 31, through the action of the guide portion 32 and the elastic piece 33, the connecting rack 21 may move along the first direction Z during moving along the second direction X. So, the hook 22 arranged on the connecting rack 21 may move along the first direction Z and the second direction X. The hook 22 moving along the first direction Z may insert into the slot 401 of the functional module 400 or extract from the slot 401 of the functional module 400. When the hook 22 inserts into the slot 401 of the functional module 400, the hook 22 may limit the position of the functional module 400, or through the hook 22 moving along the second direction X, the hook 22 may drive the functional module 400 to partially slide out of the mounting area 111. When the hook 22 separates from the slot 401, the hook 22 may extract the functional module 400 using the position limitation to the functional module 400. Through the functional module 400 directly inserting into the mounting area 111 and the hook 22 inserting into the slot 401 of the functional module 400, the functional module 400 may be mounted successfully. The mounting and dissembling process of the functional module 400 is simple and fast, no additional tools are required, the server does not need to be disassembled, the data processing equipment 001 can be kept hot-swappable when it is working, the data processing equipment 001 does not need to be disassembled or shut down, and the operation efficiency can be improved.

While the present disclosure has been described with reference to particular embodiments, the description is illustrative of the disclosure and is not to be construed as limiting the disclosure. Therefore, those of ordinary skill in the art may make various modifications to the embodiments without departing from the scope of the disclosure, as defined in the appended claims.

What is claimed is:

1. A functional module securing device comprising:
   a securing rack, the securing rack comprising a mounting area, the mounting area configured to place a functional module;
   a limit piece, the limit piece slidably arranged on an exterior of the securing rack and at least partially located in the mounting area; and
   a linkage piece, the linkage piece arranged on the exterior of the securing rack and connected to the limit piece, the linkage piece configured to drive the limit piece to move along a first direction to at least partially insert the limit piece into a slot of the functional module, or to separate the limit piece from the slot of the functional module, the linkage piece further configured to drive the limit piece to move along a second direction to drive the functional module to at least partially slide out of the mounting area when the limit piece is in the slot of the functional module;
   wherein the linkage piece comprises:
   a slide rack, the slide rack is slidably arranged on the securing rack along the second direction, the limit piece is slidably connected to the slide rack along the first direction, the slide rack is configured to drive the limit piece to move along the second direction;
   a guide portion, the guide portion is arranged on the securing rack and configured to engage with the limit piece, when the limit piece moves along the second direction, the limit piece moves along the first direction relative to the slide rack;
   the limit piece comprises a first guide groove, the first guide groove comprises a guide surface, along an insertion direction of the functional module, the guide surface is inclined toward a direction of the limit piece inserts into the slot of the functional module, and
   the guide portion is secured to a side of the securing rack and located in the first guide groove, the guide portion is in contact with the guide surface, when the limit piece moves along the second direction, the guide portion moves along the first direction relative to the slide rack.

2. The functional module securing device according to claim 1, wherein the linkage piece further comprises an elastic piece, one end of the elastic piece is connected to the slide rack, another end of the elastic piece is connected to the limit piece, the elastic piece is configured to apply a force, in a direction of the limit piece inserts into the slot of the functional module, to the limit piece.

3. The functional module securing device according to claim 1, wherein the limit piece comprises:
   a connecting rack, the connecting rack is arranged to the exterior of the securing rack and slidably arranged on the slide rack along the first direction; and
   a hook, the hook is arranged on the connecting rack and located in the mounting area, the hook is configured to insert into the slot of the functional module to limit a position of the functional module or limit the hook to synchronously move along the first direction and the second direction, the hook moves along the second direction to drive the functional module to at least partially extract from the mounting area, the hook moves along the first direction to separate from the slot of the functional module.

4. The functional module securing device according to claim 3, wherein the slide rack and the connecting rack are overlapped along a third direction, the connecting rack comprises a slide groove, the slide rack is provided with a guide post, the guide post is arranged in the slide groove along the first direction, the connecting rack is configured to move along the first direction relative to the slide rack.

5. The functional module securing device according to claim 4, wherein each of the first direction, the second direction, and the third direction is perpendicular to each other.

6. The functional module securing device according to claim 1, wherein the linkage piece further comprises:
   a rotation handle, the rotation handle is rotatably connected to the securing rack, a rotation axis of the rotation handle extends along a third direction; and
   a rod, one end of the rod is rotatably connected to the rotation handle, another end of the rod is rotatably connected to the slide rack, the rod is configured to drive the slide rack to move along the second direction.

7. The functional module securing device according to claim 1, wherein the securing rack further comprises:
   a housing, the housing comprises the mounting area; and
   a plurality of guide rail groups, the plurality of guide rail groups is arranged on an interior of the housing at intervals along the first direction, the plurality of guide rail groups is in the mounting area, each of the plurality of guide rail groups is configured to place one functional module.

8. The functional module securing device according to claim 7, wherein the each of the plurality of guide rail groups comprises two slide rails, the two slide rails are arranged at intervals along a third direction and configured to cooperatively place the functional module, each of the two slide rails comprises a slide groove, a part of the limit piece engaged with the slot of the functional module is in the slide groove.

9. A data processing equipment comprising:
   a mounting housing; and
   a functional module securing device, the functional module securing device is arranged in the mounting housing, the functional module securing device comprising:
   a securing rack, the securing rack comprising a mounting area, the mounting area configured to place a functional module;
   a limit piece, the limit piece slidably arranged on an exterior of the securing rack and at least partially located in the mounting area; and
   a linkage piece, the linkage piece arranged on the exterior of the securing rack and connected to the limit piece, the linkage piece configured to drive the limit piece to move along a first direction to at least partially insert the limit piece into a slot of the functional module, or to separate the limit piece from the slot of the functional module, the linkage piece further configured to drive the limit piece to move along a second direction to drive the functional module to at least partially slide out of the mounting area when the limit piece is in the slot of the functional module;
   wherein the linkage piece comprises:
   a slide rack, the slide rack is slidably arranged on the securing rack along a second direction, the limit piece is slidably connected to the slide rack along the first direction, the slide rack is configured to drive the limit piece to move along the second direction;
   a guide portion, the guide portion is arranged on the securing rack and configured to engage with the limit piece, when the limit piece moves along the second direction, the limit piece moves along the first direction relative to the slide rack;
   the limit piece comprises a first guide groove, the first guide groove comprises a guide surface, along an insertion direction of the functional module, the guide surface is inclined toward a direction of the limit piece inserts into the slot of the functional module, and
   the guide portion is secured to a side of the securing rack and located in the first guide groove, the guide portion is in contact with the guide surface, when the limit piece moves along the second direction, the guide portion moves along the first direction relative to the slide rack.

10. The data processing equipment according to claim 9, wherein the linkage piece further comprises an elastic piece, one end of the elastic piece is connected to the slide rack, another end of the elastic piece is connected to the limit piece, the elastic piece is configured to apply a force, in a direction of the limit piece inserts into the slot of the functional module, to the limit piece.

11. The data processing equipment according to claim 9, wherein the limit piece comprises:
   a connecting rack, the connecting rack is arranged to the exterior of the securing rack and slidably arranged on the slide rack along the first direction; and
   a hook, the hook is arranged on the connecting rack and located in the mounting area, the hook is configured to insert into the slot of the functional module to limit a position of the functional module or limit the hook to synchronously move along the first direction and the second direction, the hook moves along the second direction to drive the functional module to at least partially extract from the mounting area, the hook moves along the first direction to separate from the slot of the functional module.

12. The data processing equipment according to claim 11, wherein the slide rack and the connecting rack are overlapped along a third direction, the connecting rack comprises a slide groove, the slide rack is provided with a guide post, the guide post is arranged in the slide groove along the first direction, the connecting rack is configured to move along the first direction relative to the slide rack.

13. The data processing equipment according to claim 12, wherein each of the first direction, the second direction, and the third direction is perpendicular to each other.

14. The data processing equipment according to claim 9, wherein the linkage piece further comprises:
- a rotation handle, the rotation handle is rotatably connected to the securing rack, a rotation axis of the rotation handle extends along a third direction; and
- a rod, one end of the rod is rotatably connected to the rotation handle, another end of the rod is rotatably connected to the slide rack, the rod is configured to drive the slide rack to move along the second direction.

15. The data processing equipment according to claim 9, wherein the securing rack further comprises:
- a housing, the housing comprises the mounting area; and
- a plurality of guide rail groups, the plurality of guide rail groups is arranged on an interior of the housing at intervals along the first direction, the plurality of guide rail groups is in the mounting area, each of the plurality of guide rail groups is configured to place one functional module.

16. The data processing equipment according to claim 15, wherein the each of the plurality of guide rail groups comprises two slide rails, the two slide rails are arranged at intervals along a third direction and configured to cooperatively place the functional module, each of the two slide rails comprises a slide groove, a part of the limit piece engaged with the slot of the functional module is in the slide groove.

* * * * *